(12) United States Patent
Kek et al.

(10) Patent No.: US 6,943,378 B2
(45) Date of Patent: Sep. 13, 2005

(54) OPTO-COUPLER

(75) Inventors: Theng Hui Kek, Singapore (SG); Gary Thiam Siew Tay, Singapore (SG); Ka Hin Kwok, Singapore (SG)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/640,923

(22) Filed: Aug. 14, 2003

(65) Prior Publication Data

US 2005/0035356 A1 Feb. 17, 2005

(51) Int. Cl.[7] .............................................. H01L 27/15
(52) U.S. Cl. ............................ 257/82; 257/79; 257/80; 257/81; 257/98; 257/99
(58) Field of Search ............................. 257/79, 80, 81, 257/82, 88, 98, 99, 100

(56) References Cited

U.S. PATENT DOCUMENTS 5,049,527 A 9/1991 Merrick et al.
5,329,131 A 7/1994 Wijdenes et al.

FOREIGN PATENT DOCUMENTS

JP 06-196748 * 7/1994

* cited by examiner

*Primary Examiner*—Minhloan Tran
*Assistant Examiner*—Tan Tran

(57) ABSTRACT

An opto-coupler including an optical transmitter and an optical receiver. The opto-coupler includes at least three layers of materials between the optical transmitter and the optical receiver that attach and optically couple the optical transmitter and the optical receiver to define a stack. A method of manufacturing the opto-coupler is also disclosed. The method includes disposing an insulating layer on a first die and disposing an isolation layer on the insulating layer. The method further includes disposing a securing layer on the isolation layer and disposing a second die on the securing layer.

10 Claims, 5 Drawing Sheets

OPTO-COUPLER

BACKGROUND

This invention relates to a small-footprint opto-coupler and a method of manufacturing the same.

Prior art opto-couplers come in different configurations. Each such opto-coupler includes an optical transmitter, such as a light-emitting diode (LED), for transmitting a light signal, and an optical receiver, such as a photodiode, for receiving the light signal. Some of these opto-couplers typically include leads formed on a lead frame, and the optical transmitter and optical receiver are electrically connected to the leads using wire bonds in a wire bonding process. These wire bonds are susceptible to breakage during manufacturing, especially if the leads of the opto-couplers are subjected to rough handling.

Various configurations of opto-couplers and methods of manufacturing the same are known. By way of example, several of these are described in U.S. Pat. No. 5,049,527 (Merrick et al.), U.S. Pat. No. 5,329,131 (Wijdenes et al.), U.S. Pat. No. 4,851,695 (Stein) and U.S. Pat. No. 5,654,559 (Spaeth et al.). There remains a need for an opto-coupler that may be easily and economically manufactured.

SUMMARY

According to an aspect of the invention, there is provided an opto-coupler including an optical transmitter, an optical receiver, and at least three layers of materials between the optical transmitter and the optical receiver that attach and optically couple the optical transmitter and the optical receiver to define a stack.

According to another aspect of the invention, there is provided a method of manufacturing the above-described opto-coupler. The method includes disposing an insulating layer on a first die and disposing an isolation layer on the insulating layer. The method further includes disposing a securing layer on the isolation layer and disposing a second die on the securing layer.

BRIEF DESCRIPTION OF DRAWINGS

The invention will be better understood with reference to the drawings, in which.

DETAILED DESCRIPTION

Figure 1:
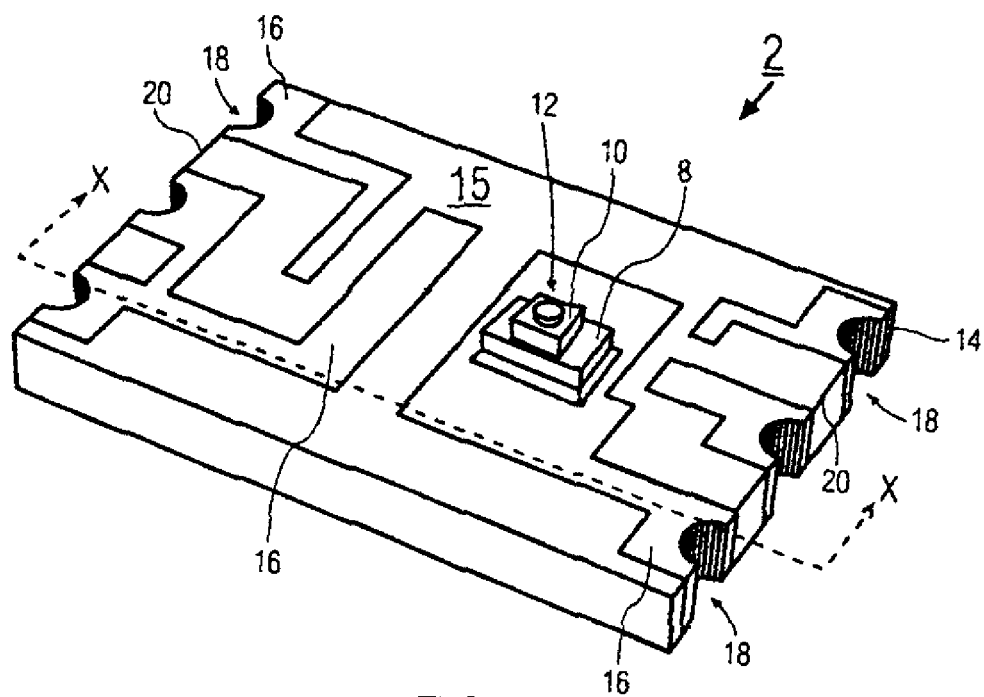
FIG. 1 is an isometric drawing of a partially completed opto-coupler, without wire bonds and without an encapsulant, according to a general embodiment of the invention.

Generally, an opto-coupler according to the invention includes an optical transmitter and an optical receiver. At least three layers of materials between the optical transmitter and the optical receiver fixedly attach and optically couple the optical transmitter and the optical receiver to define a stack. The optical transmitter is activatable for transmitting a light signal that is receivable by the optical receiver. In some embodiments, the three layers of materials are all light transmissive to allow the light signal emitted from the optical transmitter to propagate through the materials to reach the optical receiver. The opto-coupler may include a single substrate that supports the stack. The substrate has several mutually electrically insulated conductors electrically connected to the optical transmitter and optical receiver. The opto-coupler may also include an encapsulant that encloses or encapsulates the optical transmitter and the optical receiver. A method of manufacturing the opto-coupler will be described later.

With reference to FIGS. 1–3A, an opto-coupler 2 according to an embodiment of the invention includes a first die 8 fixedly attached and optically coupled to a second die 10 to define an integral stack 12 of dies 8, 10. The first die 8 is electrically insulated from the second die 10 by at least a passivation or electrically insulating layer 11, a first connecting or securing layer 62 and an isolation layer 13 between the insulation layer 11 and the first securing layer 62. These three layers 11, 13, 62 are fabricated of respective light transmissive materials in some embodiments. For example, the insulating layer 11 may be a layer of silicon dioxide, silicon nitride, benzo cyclo butene (BCB) or any other suitable insulating material. The isolation layer 13 may be a layer of glass, polyimide or like materials. The first securing layer 62 may be an epoxy layer suitable for die-attachment use. Such an epoxy includes, but is not limited to, those epoxies sold by Tra-con, Massachusetts, U.S.A.

Figure 3A:
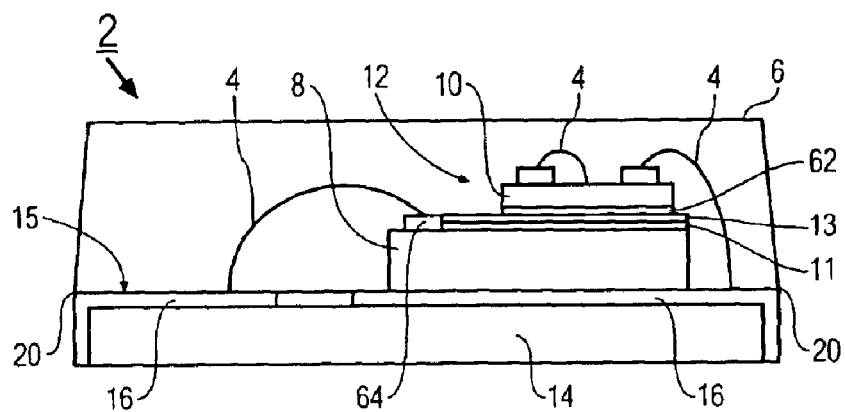
FIG. 3A is a cross-sectional view of the opto-coupler in FIG. 1, taken along a line X—X in FIG. 1, showing an optical transmitter and an optical receiver of the opto-coupler separated by three layers of light transmissive materials.
Figure 3B:
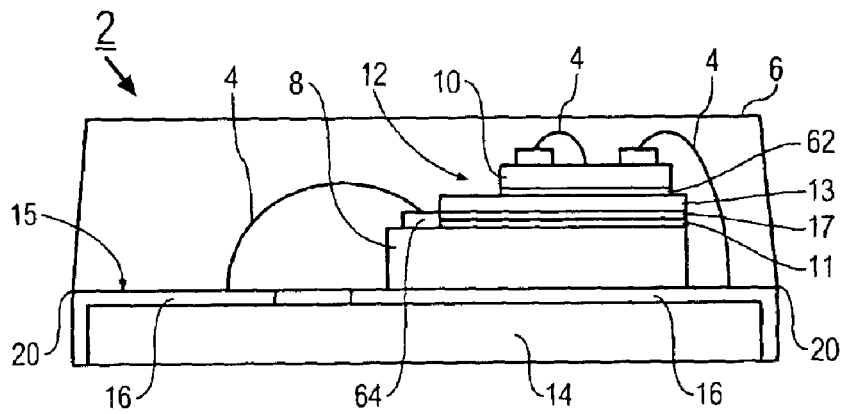
FIG. 3B is a cross-sectional view similar to that in FIG. 3A showing the optical transmitter and the optical receiver separated by four layers of light transmissive materials.

The passivation or electrically insulating layer 11 and the isolation layer 13 may be integrally formed with the first die 8 to be a part of the first die 8. These insulating layer 11 and isolation layer 13 may be formed on a wafer of first dies 8 to simultaneously cover the first dies 8, using for example known spin coating processes. The wafer is appropriately masked so that when formed, the insulating layer 11 and isolation layer 13 extend across a surface of the first die 8 leaving conductors 64 exposed on the surface as shown in FIG. 3A. It is feasible to form an isolation layer 13 in this manner to a thickness of about 3 mils. The second die 10 is attached to the isolation layer 13 using the first securing layer 62. Alternatively, only the insulating layer 11 may be integrally formed with the first die 8 as described above. The isolation layer 13 may then be subsequently attached to the insulating layer 11 using a second securing layer 17 as shown in FIG. 3B. The thickness of the isolation layer 13 is dependent on the voltage difference that may be present between the two dies 8, 10.

In this embodiment, the first die 8 may either be an optical transmitter die or an optical receiver die. If the first die 8 is an optical transmitter die, the second die 10 is an optical receiver die. However if the first die 8 is an optical receiver die, the second die 10 is then an optical transmitter die. The optical transmitter die is activatable for transmitting a light signal that is receivable by the optical receiver die to thereby cause the optical receiver die to be correspondingly activated. The optical transmitter die may be a light-emitting-diode (LED) die and the optical receiver die may be a photo-diode, a photo-transistor or the like.

The stack 12 is supported by a single substrate on one surface thereof. The substrate is fabricated of a printed circuit material, for example as shown in FIGS. 1–4D as a printed circuit board (PCB) 14. The PCB 14 includes several mutually electrically insulated conductors 16 formed on a single surface 15 of the PCB 14 that supports the stack 12. In some embodiments, these conductors 16 extend over recessed portions 18 of at least one of the edges 20 of the PCB 14, such as on two oppositely facing edges 20 as shown in FIG. 1. The first die 8 and the second die 10 are electrically connected to corresponding conductors 16 on the PCB 14 using connectors such as wire bonds 4.

Figure 2:
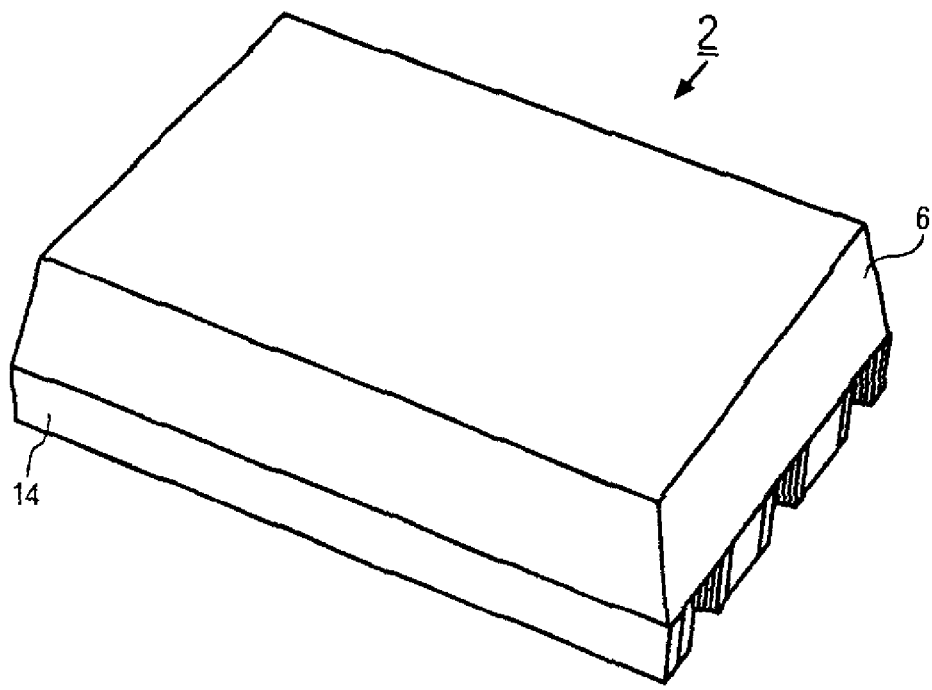
FIG. 2 is an isometric drawing of the opto-coupler in FIG. 1 shown complete with an encapsulant.

The stack 12 and associated wire bonds 4 are encapsulated with an opaque encapsulant 6 to define a complete opto-coupler 2 as shown in FIG. 2. Parts of the conductors on the edges 20 of the PCB 14 are left exposed to serve as external contacts for the opto-coupler 2. During use, the opto-coupler 2 is surface-mounted on a second PCB (not shown) with the external contacts of the opto-coupler 2 in contact with corresponding conductors on the second PCB. The contacts and the corresponding conductors are electrically connected using solder, for example, by passing the second PCB with the opto-coupler 2 mounted thereon through a solder reflow process, such as is known in the art (not shown).

Figure 4A:
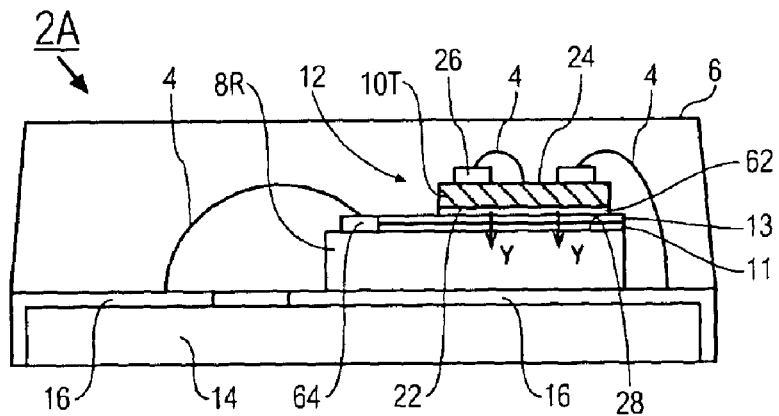
FIG. 4A is a cross-sectional view of the opto-coupler, similar to that in FIG. 3A, according to a first embodiment of the invention, wherein the opto-coupler includes a back-emitting LED for directly transmitting a light signal onto a photosensitive surface of an optical receiver below the LED.

With reference to FIG. 4A, the first die 8 in a first opto-coupler 2A is an optical receiver die 8R, one side of which is directly attached to the PCB 14 for the PCB 14 to support the stack 12. Accordingly, the second die 10 is an optical transmitter die 10T that is attached to the other side of the optical receiver die 8R with three layers 11, 13, 62 of light transmissive materials therebetween. The optical transmitter die 10 of this first opto-coupler 2A is a back-emitting LED die 10T. Unlike typical front-emitting LEDs which have connection pads on a light-emitting surface, such a back-emitting LED die 10T has connection pads 26 on a surface 24 that is opposite to a light-emitting surface 22 of the LED die 10T as shown in FIG. 4A. The optical receiver die 8R is a typical front-receiving optical receiver die, which has connection pads 64 on a photosensitive surface 28 of the optical receiver die 8R. A light signal emitted from the back-emitting LED die 10T propagates through the light transmissive layers 11, 13, 62 to reach the photosensitive surface 28 of the optical receiver die 8R.

Figure 4B:
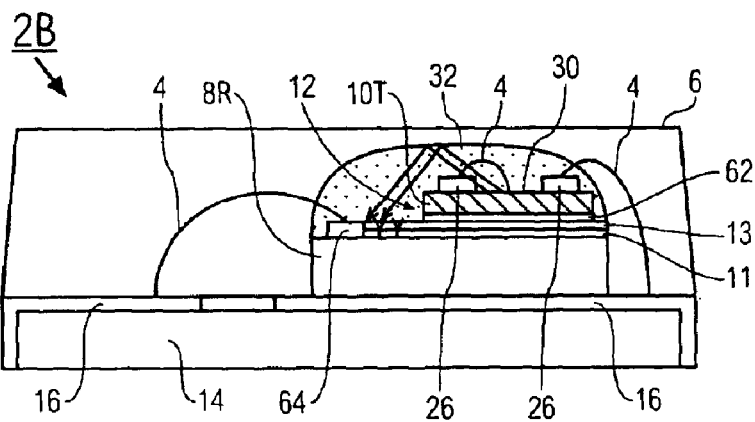
FIG. 4B is a cross-sectional view of the opto-coupler, similar to that in FIG. 3A, according to a second embodiment of the invention, wherein the opto-coupler includes a front-emitting LED for transmitting a light signal that is reflected by a light guide onto a photosensitive surface of an optical receiver below the LED.

With reference to FIG. 4B, the first die 8 in a second opto-coupler 2B is also an optical receiver die 8R similar to that of the first opto-coupler 2A. The second die 10 however is a front-emitting LED type of optical transmitter die 10T. Such an LED die has a light-emitting surface 30 on which connection pads 26 are also formed. This second opto-coupler 2B further includes a light transmissive guide 32 that covers at least a portion of the optical transmitter die 10T and at least a portion of the optical receiver die 8R for guiding a light signal (indicated by arrows Y) transmitted from the optical transmitter die 10T to the optical receiver die. The light transmissive guide 32 guides the light signal by reflection. In the second opto-coupler 2B, the three layers 11, 13, 62 need not be light transmissive.

Figure 4C:
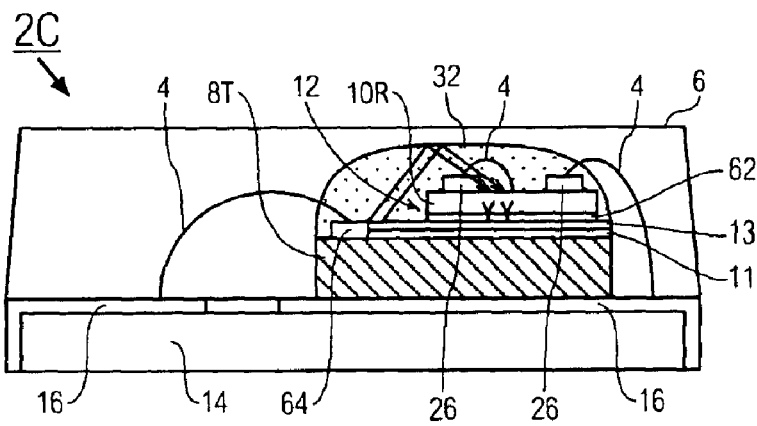
FIG. 4C is a cross-sectional view of the opto-coupler, similar to that in FIG. 3A, according to a third embodiment of the invention, wherein the opto-coupler includes a front-emitting LED for transmitting a light signal that is reflected by a light guide onto a photosensitive surface of an optical receiver above the LED.

With reference to FIG. 4C, the first die 8 in a third opto-coupler 2C is an optical transmitter die 8T, one side of which is directly attached to the PCB 14 for the PCB 14 to thereby support the stack 12. The second die 10 is a typical front-receiving optical receiver die 10R attached to the other side of the optical transmitter die. This third opto-coupler 2C also includes a light transmissive guide 32 that guides the light signal (indicated by arrows Y) transmitted from the optical transmitter die 8T to the optical receiver die 10R. The light transmissive guide 32 guides the light signal by reflection. Again in this embodiment, the three layers of materials 11, 13, 62 of materials between the optical transmitter die 8T and the optical receiver die 10R need not be light transmissive.

Figure 4D:
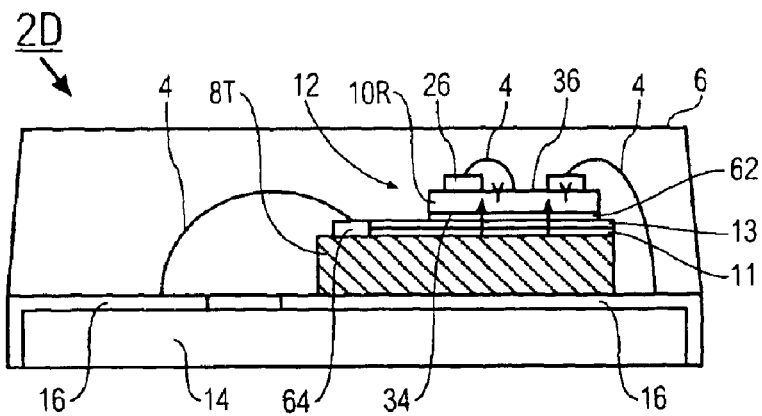
FIG. 4D is a cross-sectional view of the opto-coupler, similar to that in FIG. 3A, according to a fourth embodiment of the invention, wherein the opto-coupler includes a front-emitting LED for directly transmitting a light signal directly onto a photosensitive undersurface of an optical receiver above the LED.

With reference to FIG. 4D, the first die 8 in a fourth opto-coupler 2D is an optical transmitter die 8T, one side of which is directly attached to the PCB 14, similar to that of the third opto-coupler 2C. The second die 10 is however a back-receiving optical receiver die having a photosensitive surface 34 that is opposite to a surface 36 on which connection pads 26 are formed. The second die 10R is attached to the optical transmitter die 8T with the photosensitive surface 34 directly facing the optical transmitter die 8T. The optical transmitter die 8T transmits a light signal, indicated by arrows Y, directly to the photosensitive surface 34 of the optical receiver die 10R through three layers 11, 13, 62 of light transmissive materials.

Figure 5:
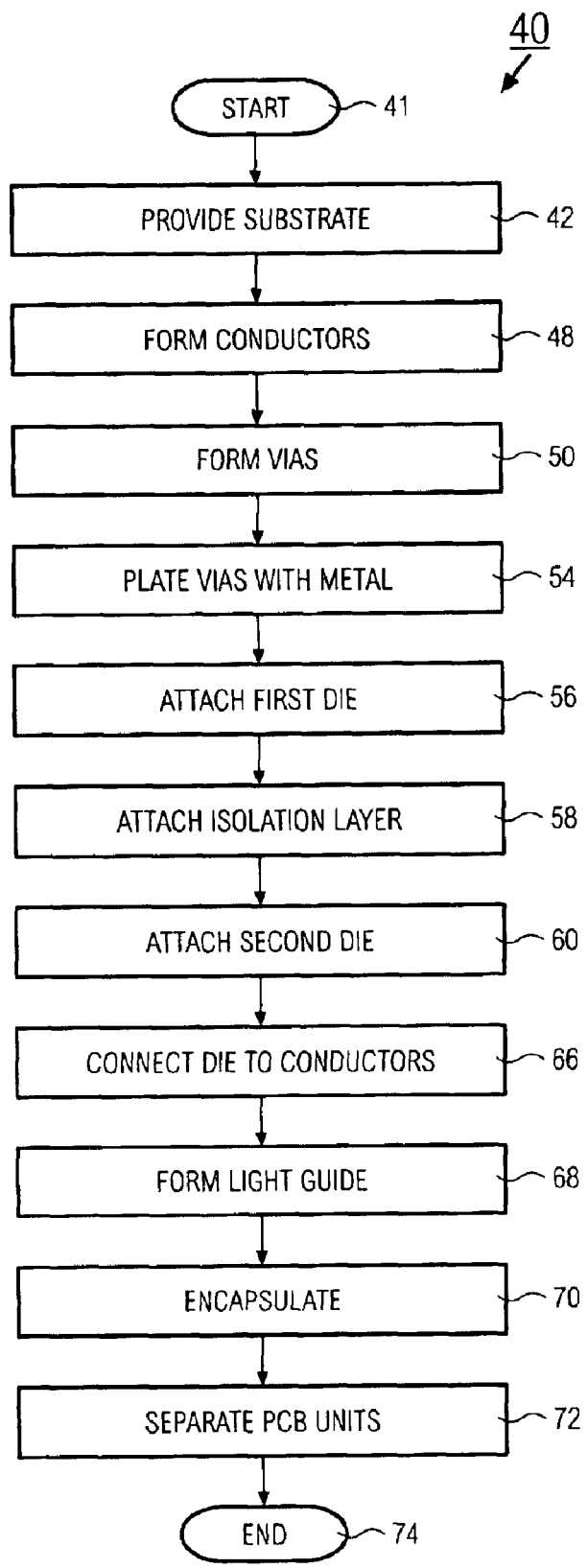
FIG. 5 is a flow diagram of a method of steps for manufacturing the opto-couplers in FIGS. 4A–4D according to an embodiment of the invention.
Figure 6:
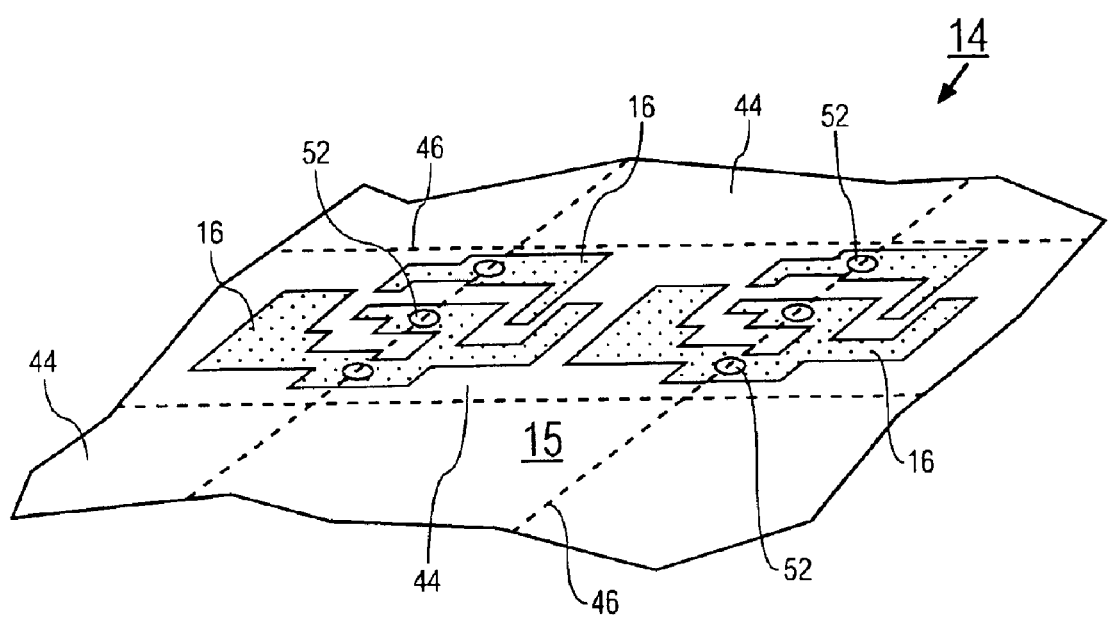
FIG. 6 is an isometric drawing of a portion of a surface of a printed circuit board (PCB) that is used to manufacture the opto-couplers in FIGS. 4A–4D.

With reference to FIG. 5, a method 40 for manufacturing the opto-couplers 2A–2D in FIGS. 4A–4D starts in a START step 41 before proceeding to a PROVIDE SUBSTRATE step 42, wherein a substrate, such as a PCB 14 (a surface portion of which is shown in FIG. 6), is provided for forming multiple opto-couplers 2A–2D therewith. The PCB 14 includes multiple PCB units 44 adjoined along their boundaries indicated by sectioning lines 46 in FIG. 6. Each of the PCB units 44 is used to build a single opto-coupler 2A–2D. The method 40 next proceeds to a FORM CONDUCTORS step 48, wherein mutually electrically insulated conductors 16 for each of the opto-couplers 2A–2D are formed on a surface 15 of the PCB 14 by any conventional techniques, such as by photolithography and etching. The conductors 16 for each of the opto-couplers 2A–2D may for example be formed according to a pattern shown in FIGS. 1 and 6.

The method 40 next proceeds to a FORM VIAS step 50, wherein vias 52 are formed along the boundaries of the PCB units 44 indicated by the sectioning lines 46. These vias 52 are formed from the conductors 16 on one side of the PCB 14 through the underlying material of the PCB 14 to the other side of the PCB 14. The vias 52 may be formed using any conventional techniques, such as stamping, drilling, direct laser scoring or the like. The opening of the vias 52 may be circular in shape and of a diameter that is wider than the width of a saw (not shown) that will be subsequently used to cut the PCB 14 to separate the PCB units 44. After the vias 52 are formed, the vias 52 are plated with an electrically conductive metal using any conventional techniques in a PLATE VIAS WITH METAL step 54. The metal plating in each via 52 is electrically connected with its associated conductor 16 to thereby electrically route the conductor 16 to an edge 20 of the PCB unit 44.

The method 40 next proceeds to an ATTACH FIRST DIE step 56, wherein a first die 8 is attached or mounted to each of the PCB units 44 using any conventional die-attach techniques. This first die 8 may be either an optical transmitter die or an optical receiver die depending on which of the embodiments of the opto-coupler 2A–2D as described above is to be built. The first die 8 may optionally include a ground plane on a first side of the first die 8. The first die 8 can be mounted on its corresponding PCB unit 44 with this ground plane directly attached to a surface of one of the conductors 16 of the corresponding PCB unit 44 using a layer of electrically conductive silver epoxy to thereby electrically connect the ground plane with the conductor 16. By mounting the first die 8 to the corresponding PCB unit 44 in this manner, heat generated in the first die 8 during use of the opto-coupler 2A–2D may be dissipated through the ground plane and the conductor 16 connected thereto.

The first die 8 includes a layer of optically transmissive passivation or electrically insulating layer 11 disposed on a second side of the first die 8, opposite the first side. This insulating layer 11 is typically prefabricated or preformed on a suitably masked wafer having multiple first dies 8 to simultaneously cover the first dies 8. The insulating layer is typically formed on the wafer using an oxidation process. The wafer is singulated to produce individualized first dies 8. This insulation layer 11 may be of silicon dioxide, silicon nitride, benzo cyclo butene (BCB) or any other suitable insulating material. For manufacturing the first and the fourth opto-couplers 2A, 2D described above, this passivation or insulating layer 11 is optically transmissive to allow light therethrough. The first die 8 may optionally include an integrally formed outermost insulation layer 13 that is disposed on the passivation layer 11 to function as an isolation layer 13. The isolation layer may for example be spin coated on the insulating layer 11 on the wafer of first dies 8 to simultaneously cover the insulating layer 11 on each of the first dies 8 before the first dies 8 are singulated. When integrally formed in this manner, this outermost isolation layer 13 may be fabricated of optically transmissive polyimide for the first opto-coupler 2A and the fourth opto-coupler 2D.

Alternatively, the isolation layer 13 may be a separate layer of glass, polyimide or any other suitable optically transmissive material of a predetermined thickness that is attached to the first die 8 in an optional ATTACH ISOLATION LAYER step 58 of the method 40. Such a step 58 may be performed for example by using a die-attach operation which involves first disposing a second securing layer 17 on the insulating layer 11 of the first die 8 followed by disposing the separate isolation layer 13 on the second securing layer 17. The second securing layer 17 is heated in an oven set to a temperature of between 100–175 degree Celsius for a period of about 0.5–2 hours in the die-attach operation to cure it so that the isolation layer 13 is firmly attached to the second securing layer 17.

The method 40 next proceeds to an ATTACH SECOND DIE step 60 using for example once again a die-attach operation, which includes first disposing a first securing layer 62 on the isolation layer 13 followed by disposing the second die 10 on the first securing layer 62. Similarly, the first securing layer 62 is heated to cure it so that the second die 10 is firmly attached to the isolation layer 13. In this manner, the second die 10 is fixedly attached to or mounted on the first die 8 on each of the PCB units 44 to define a stack 12 of two dies 8, 10. The securing layers 17, 62 are optically transmissive for the first and fourth opto-couplers 2A, 2D. If the first die 8 is an optical transmitter die, the second die 10 is an optical receiver die. However, if the first die 8 is an optical receiver die, the second die 10 is then an optical transmitter die. The second die 10 is smaller than the first die 8 so that when the second die 10 is attached to the first die 8, connection pads 64 on the first die 8 are not covered by the second die 10 but are left at least partially exposed. The first die 8 and the second die 10 are optically coupled.

After the dies 8, 10 are mounted, the method 40 proceeds to a CONNECT DIE TO CONDUCTORS step 66. In this step 66, the connection pads 26, 64 of the first die 8 and the second die 10 on each PCB unit 44 are electrically connected using connectors to their corresponding conductors 16 of a corresponding PCB unit 44. These connectors may for example be wire bonds 4.

Thereafter, should the opto-coupler to be built be of the types of the second and third opto-couplers 2B, 2C described above, the method 40 proceeds to another optional FORM LIGHT GUIDE step 68. In this step 68, a light transmissive guide 32 is provided to cover at least a portion of the dies 8, 10 on each PCB unit 44 such that light emitted or transmitted from the optical transmitter die is reflected by the light transmissive guide 32 onto the photosensitive surface of the optical receiver die. This light transmissive guide 32 may be formed using a drop of optically transmissive silicone rubber which may be coated on its exposed surface after its formation with a white reflective layer (not shown), for example, silicon rubber mixed with titanium dioxide known to those skilled in the art. This light transmissive guide 32 is not required if a light emitting surface of the optical transmitter die directly faces a photosensitive surface of the optical receive die as in the case of the first and fourth opto-couplers 2A, 2D.

The method 40 next proceeds to an ENCAPSULATE step 70, wherein the stack 12, associated wire bonds 4 and light transmissive guide 32, if present, on each PCB unit 44 are encapsulated with a transfer molding compound using any conventional transfer molding techniques. The method 40 next proceeds to a SEPARATE PCB UNITS step 72, wherein the PCB 14 is cut along the sectioning lines 46 through the vias 52 to form individualized opto-couplers 2A–2D, one of which is shown in FIG. 2. The cutting exposes the metal platings in the vias 56 to define conductors on recessed portions 18 of at least one edge 20 of each PCB unit 44. The method 40 finally ends in an END step 74.

Opto-couplers according to the invention are robust. They include a rigid substrate, giving strength and reliability. They may be manufactured simply and economically with very few steps in a process having high yield. They have a very small footprint.

Although the invention is described as implemented in the above-described embodiments, it is not to be construed to be limited as such. For example, the optical transmitter die and optical receiver die may be arranged such that the light emitting surface of the optical transmitter die is disposed at an angle, for example at a right angle, to the photosensitive surface of the optical receiver die.

We claim:

1. An opto-coupler comprising:
   an optical transmitter;

an optical receiver;

at least three layers of materials between the optical transmitter and the optical receiver to attach and optically couple the optical transmitter and the optical receiver to define a stack;

said at least three layers of materials comprising a glass isolation layer sandwiched between two epoxy securing layers, wherein the area of said glass isolation layer is greater than the area of an active face of said optical transmitter; and said stack electrically and mechanically attached to the surface of a printed circuit board having electrical conductors thereon.

2. An opto-coupler according to claim 1, wherein said at least three layers further comprises a silicon dioxide, silicon nitride, or benzo cyclo butene insulating layer that is an integrally formed part of the optical receiver and wherein one of said epoxy securing layers attaches the insulating layer to the glass isolation layer.

3. An opto-coupler according to claim 1, further comprising a light transmissive guide that covers at least a portion of the optical transmitter and at least a portion of the optical receiver for guiding a light signal from the optical transmitter to the optical receiver.

4. An opto-coupler according to claim 3, wherein the optical transmitter comprises a front-emitting LED and wherein the light transmissive guide comprises a reflective surface for reflecting the light signal transmitted by the front-emitting LED to the optical receiver.

5. An opto-coupler according to claim 1, further comprising an encapsulant that encloses the optical transmitter and the optical receiver.

6. An opto-coupler comprising:

an optical transmitter;

an optical receiver;

at least three layers of materials between the optical transmitter and the optical receiver to attach and optically couple the optical transmitter and the optical receiver to define a stack;

said at least three layers of materials comprising a polyimide isolation layer sandwiched between two epoxy securing layers, wherein the area of said polyimide isolation layer is greater than the area of an active face of said optical transmitter; and said stack electrically and mechanically attached to the surface of a printed circuit board having electrical conductors thereon.

7. An opto-coupler according to claim 6, wherein said at least three layers further comprises a silicon dioxide, silicon nitride, or benzo cyclo butene insulating layer that is an integrally formed part of the optical receiver and wherein one of said epoxy securing layers attaches the isolation layer to the polyimide isolation layer.

8. An opto-coupler according to claim 6, further comprising a light transmissive guide that covers at least a portion of the optical transmitter and at least a portion of the optical receiver for guiding a light signal from the optical transmitter to the optical receiver.

9. An opto-coupler according to claim 8, wherein the optical transmitter comprises a front-emitting LED and wherein the light transmissive guide comprises a reflective surface for reflecting the light signal transmitted by the front-emitting LED to the optical receiver.

10. An opto-coupler according to claim 6, further comprising an encapsulant that encloses the optical transmitter and the optical receiver.

* * * * *